(12) United States Patent
Yeh et al.

(10) Patent No.: US 8,890,156 B2
(45) Date of Patent: Nov. 18, 2014

(54) ACTIVE DEVICE AND ACTIVE DEVICE ARRAY SUBSTRATE

(71) Applicants: Cheng-Yen Yeh, Taichung (TW); Yu-Ting Chen, Taoyuan County (TW)

(72) Inventors: Cheng-Yen Yeh, Taichung (TW); Yu-Ting Chen, Taoyuan County (TW)

(73) Assignees: Donnguan Masstop Liquid Crystal Display Co., Ltd., Guangdong Province (CN); Wintek Corporation, Taichung (TW)

( * ) Notice: Subject to any disclaimer, the term of this patent is extended or adjusted under 35 U.S.C. 154(b) by 0 days.

(21) Appl. No.: 13/798,144

(22) Filed: Mar. 13, 2013

(65) Prior Publication Data
US 2013/0240886 A1 Sep. 19, 2013

(30) Foreign Application Priority Data
Mar. 14, 2012 (TW) .............................. 101108652 A (51) Int. Cl.
*H01L 27/12* (2006.01)
*H01L 29/786* (2006.01)

(52) U.S. Cl.
CPC ......... *H01L 27/1222* (2013.01); *H01L 27/1225* (2013.01); *H01L 27/1251* (2013.01)
USPC .......................................................... 257/59

(58) Field of Classification Search
USPC ................. 257/401, 57–59, 61; 438/158–160
See application file for complete search history.

(56) References Cited

U.S. PATENT DOCUMENTS 5,946,562 A * 8/1999 Kuo ............................. 438/166
2009/0014799 A1* 1/2009 Isobe ........................... 257/351

* cited by examiner

*Primary Examiner* — Daniel Shook
(74) *Attorney, Agent, or Firm* — Jianq Chyun IP Office (57) ABSTRACT

An active device and an active device array substrate are provided, wherein the active device array substrate includes a substrate and a plurality of active devices being located on the substrate, and at least one of the active devices includes a first thin film transistor and a second thin film transistor. The first thin film transistor is located on the substrate and has a first channel layer. The second thin film transistor stacks on the first thin film transistor, wherein the second thin film transistor has a second channel layer. The first thin film transistor and the second thin film transistor share a common gate electrode and the common gate electrode is located between the first channel layer and the second channel layer.

15 Claims, 13 Drawing Sheets

ACTIVE DEVICE AND ACTIVE DEVICE ARRAY SUBSTRATE

CROSS-REFERENCE TO RELATED APPLICATION

This application claims the priority benefit of Taiwan application serial no. 101108652, filed on Mar. 14, 2012. The entirety of the above-mentioned patent application is hereby incorporated by reference herein and made a part of this specification.

BACKGROUND OF THE INVENTION

1. Technical Field

The invention relates to an active device and an active device array substrate, and more particularly, relates to a dual-channel active device and a dual-channel active device array substrate.

2. Description of Related Art

As electronic technology develops, the thin film transistor liquid crystal display (TFT LCD) having superior properties such as high definition, great space utilization, low power consumption and no radiation gradually becomes a mainstream in the display market.

To satisfy the demand for large-sized and high-resolution TFT LCDs, the thin film transistor is required to have high-mobility carriers, so as to shorten the charge and discharge time. Generally, for the consideration of high mobility, high stability, and low production cost, semiconductor layers of the TFTs in the driving circuit are manufactured with amorphous silicon (a-Si). However, the application of amorphous silicon thin film transistor (a-Si TFT) in high-efficiency circuits is limited by its driving capacity. As a result, amorphous silicon thin film transistor cannot integrate the peripheral high-speed driving circuit and control circuit.

In order to improve the ON-current of the amorphous silicon thin film transistor, and further to integrate circuit layout, reduce device area, and improve pixel aperture ratio, the conventional technique modifies the structure and configuration of the semiconductor channel layer, such as altering channel width and length of the semiconductor layer. However, the conventional technique cannot effectively improve the ON-current due to the limitations of the manufacturing process. Otherwise, the device size of a-Si TFT is increased to improve the ON-current. However, this technique causes reduction of the pixel aperture ratio and decreases the overall brightness of the TFT LCDs, and threshold voltage shift may easily occur. In addition, a dual gate may also be utilized to improve the ON-current. However, the dual gate structure requires a thin film transistor that includes a front channel and a back channel. The back channel may easily cause damage to the channel layer during the manufacturing process. Therefore, the dual gate structure faces the problem that the current may be attenuated easily and the improvement of the ON-current is limited. Moreover, this technique cannot integrate the circuit layout to reduce the device area of TFT, improve pixel aperture ratio, and maintain high brightness.

SUMMARY OF THE INVENTION

An active device array substrate is provided, which utilizes a three-dimensional stack structure of a single gate electrode and dual channels to achieve circuit layout integration and improve ON-current.

An active device is provided, which utilizes a three-dimensional stack structure of a single gate electrode and dual channels to effectively improve ON-current.

An active device array substrate is provided, which includes a substrate and a plurality of active devices on the substrate, and at least one of the active devices includes a first transistor and a second transistor. The first transistor is disposed on the substrate, and the first transistor includes a first channel layer. The second transistor is stacked on the first transistor, and the second transistor includes a second channel layer. The first transistor and the second transistor share a common gate electrode, and the common gate electrode is disposed between the first channel layer and the second channel layer.

In an embodiment of the disclosure, the first transistor includes a first source, a first drain, a first doped amorphous silicon layer, and a first gate insulating layer. The first source and the first drain are disposed between the common gate electrode and the substrate. The first doped amorphous silicon layer is disposed between the first source and the first channel layer and between the first drain and the first channel layer. The first gate insulating layer is disposed between the common gate electrode and the first channel layer.

In an embodiment of the disclosure, the second transistor includes a second gate insulating layer, a second source, a second drain, and a second doped amorphous silicon layer. The second gate insulating layer is disposed between the common gate electrode and the second channel layer. The second source and the second drain are disposed on two sides of the second channel layer. The second doped amorphous silicon layer is disposed between the second source and the second channel layer and between the second drain and the second channel layer.

In an embodiment of the disclosure, the first transistor and the second transistor are electrically connected in series.

In an embodiment of the disclosure, the first transistor and the second transistor are electrically connected in parallel.

In an embodiment of the disclosure, the active device array substrate further includes a protective layer and a pixel electrode. The protective layer has an opening that exposes the second drain, and the pixel electrode is electrically connected with the second drain via the opening.

In an embodiment of the disclosure, the active device array substrate further includes a protective layer, a first signal line, and a second signal line. The first gate insulating layer has a contact via that exposes the first source, and the first signal line is electrically connected with the first source through the contact via. The protective layer has an opening that exposes the second drain, and the second signal line is electrically connected with the second drain through the opening.

Furthermore, an active device disposed on a substrate is provided. The active device includes a first transistor and a second transistor. The first transistor is disposed on the substrate, and the first transistor includes a first channel layer. The second transistor is stacked on the first transistor, and the second transistor includes a second channel layer. The first transistor and the second transistor share a common gate electrode, and the common gate electrode is disposed between the first channel layer and the second channel layer.

Based on the above, in the active device of the active device array substrate of the disclosure, the single gate electrode is configured between the dual channels to increase the effective width of the device and thereby multiply the charge capacity of the thin film transistor. In addition, the two-dimensional circuit layout is integrated in a three-dimensional way by vertically configuring the gate electrode, dual channels, dual sources, and dual drains on the substrate, so as to further reduce the layout area of the circuit layout and effectively improve pixel aperture ratio, or effectively reduce the space for the circuit layout. Accordingly, the difficulty of maintaining the driving capacity and aperture ratio of the thin film transistor at the same time, which occurs in the conventional large-sized devices, is overcome.

In order to make the aforementioned and other features and advantages of the disclosure more comprehensible, exemplary embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
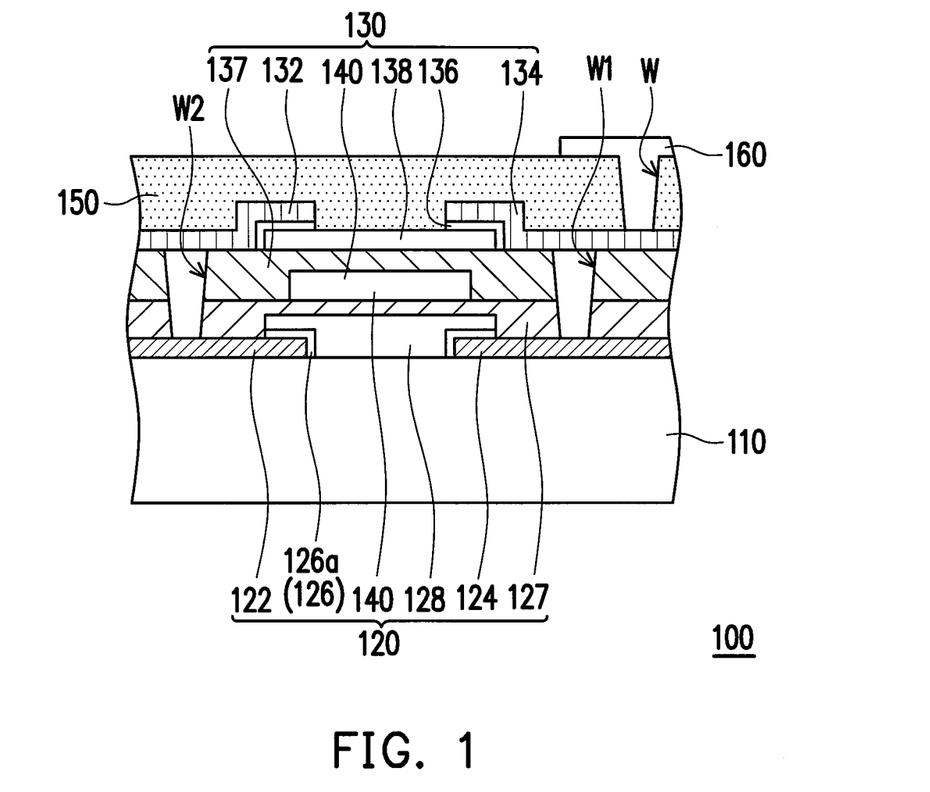
FIG. 1 is a schematic cross-sectional view of an active device array substrate according to the first embodiment of the disclosure.

FIG. 1 is a schematic cross-sectional view of an active device array substrate according to the first embodiment of the disclosure. Referring to FIG. 1, an active device array substrate 100 of this embodiment includes a substrate 110, a first transistor 120, a second transistor 130, a common gate electrode 140, a protective layer 150, and a pixel electrode 160. The first transistor 120 is disposed on the substrate 110, wherein the first transistor 120 includes a first channel layer 128. The second transistor 130 is stacked on the first transistor 120, wherein the second transistor 130 includes a second channel layer 138. The first transistor 120 and the second transistor 130 share the common gate electrode 140, and the common gate electrode 140 is disposed between the first channel layer 128 and the second channel layer 138.

More specifically, the first transistor 120 includes a first source 122, a first drain 124, a first doped amorphous silicon layer 126, and a first gate insulating layer 127. The first source 122 and the first drain 124 are disposed between the common gate electrode 140 and the substrate 110. First doped amorphous silicon patterns 126a, which are separated from each other in the first doped amorphous silicon layer 126, are respectively disposed between the first source 122 and the first channel layer 128 and between the first drain 124 and the first channel layer 128. The first gate insulating layer 127 is disposed between the common gate electrode 140 and the first channel layer 128.

In addition, the second transistor 130 includes a second gate insulating layer 137, a second source 132, a second drain 134, and a second doped amorphous silicon layer 136. The second gate insulating layer 137 is disposed between the common gate electrode 140 and the second channel layer 138. The second source 132 and the second drain 134 are configured on two sides of the second channel layer 138. The second doped amorphous silicon layer 136 is disposed between the second source 132 and the second channel layer 138 and between the second drain 134 and the second channel layer 138.

It is noted that, in this embodiment, the channel length is doubled within the limited area to increase the charge capacity of the TFT device. A manufacturing process thereof is explained below. FIGS. 2A~2F are schematic top views, illustrating a manufacturing process of the active device array substrate according to the first embodiment of the disclosure.

Figure 2A:
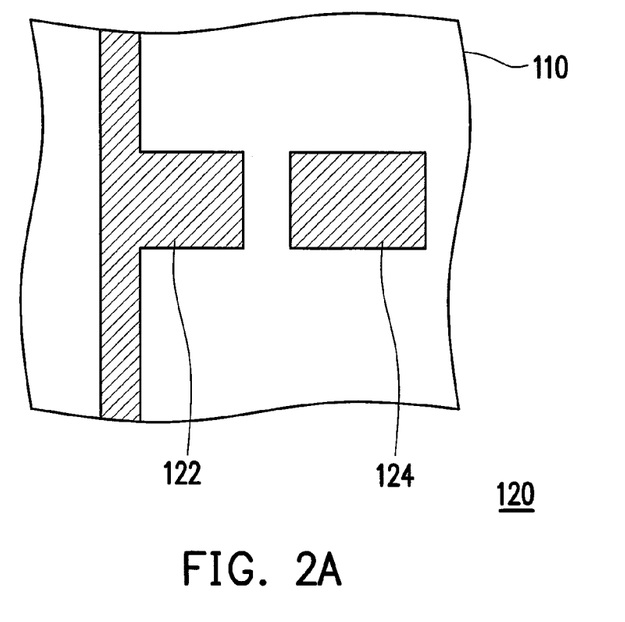
FIGS. 2A~2F are schematic top views, illustrating a manufacturing process of the active device array substrate according to the first embodiment of the disclosure.

Referring to FIG. 2A, a first metal layer (not shown) is formed on the substrate 110 and then patterned to form the first source 122 and the first drain 124, wherein the first source 122 and the first drain 124 are not electrically connected. A material thereof is a metal, such as molybdenum (Mo), aluminum (Al), titanium (Ti), etc., or a metal stack layer.

Figure 2B:
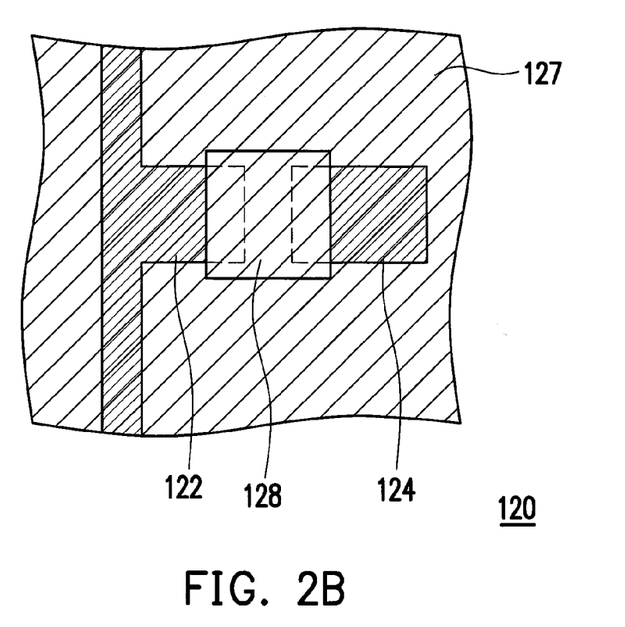

Referring to FIG. 2B (the top view of FIG. 2B only depicts the layers that are seen from the top; thus, a part of the elements are not shown in FIG. 2B; please also refer to FIG. 1 for relative positions of the described elements), the first doped amorphous silicon layer (not shown) is formed on a side of the first source 122 and the first drain 124, which is opposite to the substrate 110. To avoid short circuit of the first source 122 and the first drain 124, the first doped amorphous silicon layer is patterned first to remove a part of the first doped amorphous silicon layer between the first source 122 and the first drain 124, so as to form a first doped amorphous silicon pattern. A material of the first doped amorphous silicon pattern 126a is an n-type doped amorphous silicon material, for example. A channel layer (not shown) is formed on the first doped amorphous silicon pattern 126a. The channel layer (not shown) and the first doped amorphous silicon pattern 126a are etched simultaneously to form the first channel layer 128 and the first doped amorphous silicon layer 126, wherein the first doped amorphous silicon layer 126 includes two first doped amorphous silicon patterns 126a respectively located on the first source 122 and the first drain 124. The first doped amorphous silicon patterns 126a are aligned with the first channel layer 128. Further, the first gate insulating layer 127 is formed on the first channel layer 128.

It is noted that, in this embodiment, the first channel layer 128 is located between the first gate insulating layer 127 and the first source 122 and between the first gate insulating layer 127 and the first drain 124, which is a top gate structure. In terms of the application in LCD, if a direct-type backlight unit is adopted as the light source, a leakage current may occur because the first channel layer 128 of the first transistor 120 is exposed to the backlight. For this reason, the conventional technique usually includes an additional light-shielding process, such as adding a metal and an all-over insulating layer, to prevent the leakage current. By contrast, in this embodiment, a special transparent conductive oxide semiconductor material, such as Indium-Gallium-Zinc Oxide, is used to form the first channel layer 128. Because this type of material is hardly affected by light illumination, the active device in this embodiment does not require the additional light-shielding layer (i.e. a metal or an all-over insulating layer) to prevent the leakage current. However, it should be noted that the disclosure is not limited to the above. In other embodiments of the disclosure, the first channel layer 128 is formed of other suitable semiconductor materials.

Figure 2C:
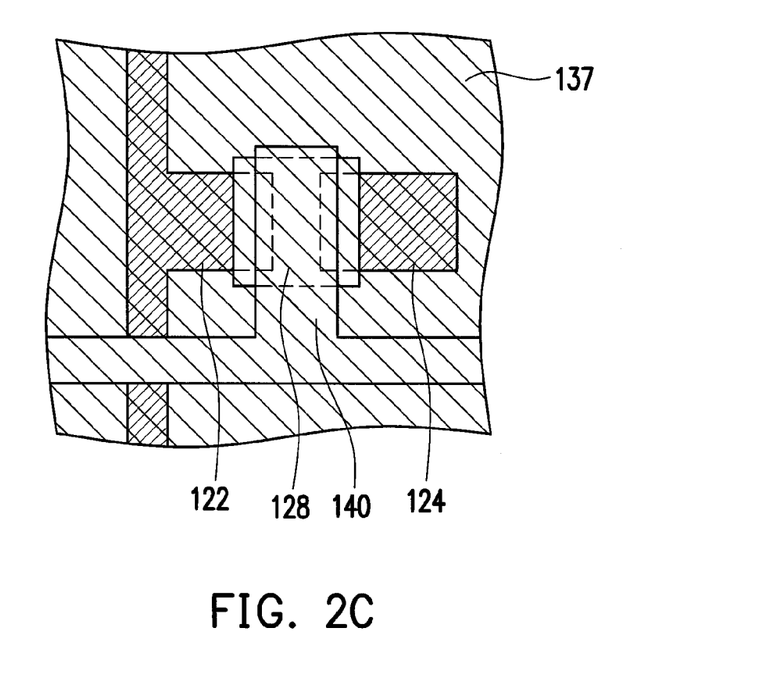

With reference to FIG. 2C, a second metal layer (not shown) is formed on the first gate insulating layer 127 and then patterned to form the common gate electrode 140. A material of the common gate electrode 140 is a metal, such as molybdenum (Mo), aluminum (Al), titanium (Ti), etc., or a metal stack layer. Accordingly, the first transistor 120 is formed based on the above. Next, the second gate insulating layer 137 is formed on a side of the common gate electrode 140, which is opposite to the first gate insulating layer 127.

Figure 2D:
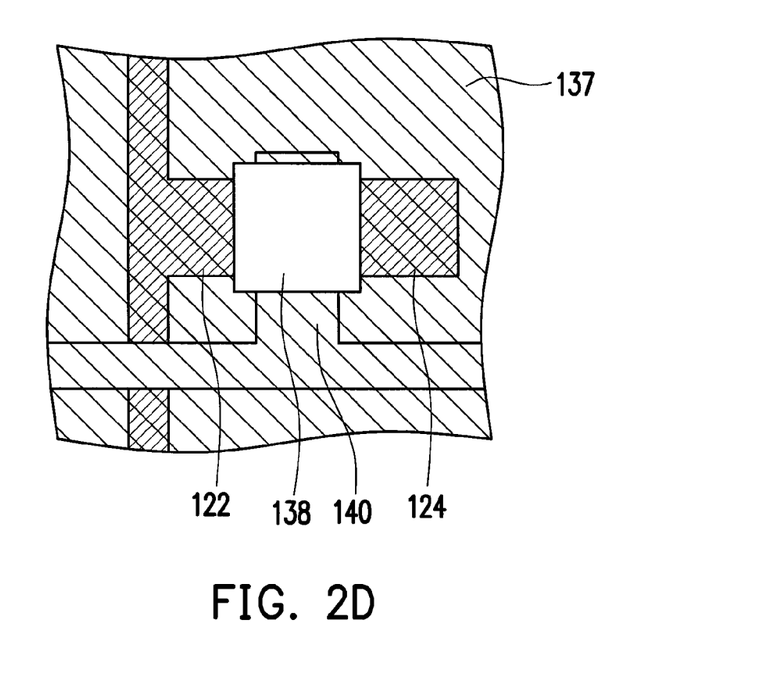

Referring to FIG. 2D, the second channel layer 138 and the second doped amorphous silicon layer 136 are formed sequentially on a side of the second gate insulating layer 137, which is opposite to the substrate 110.

Figure 2E:
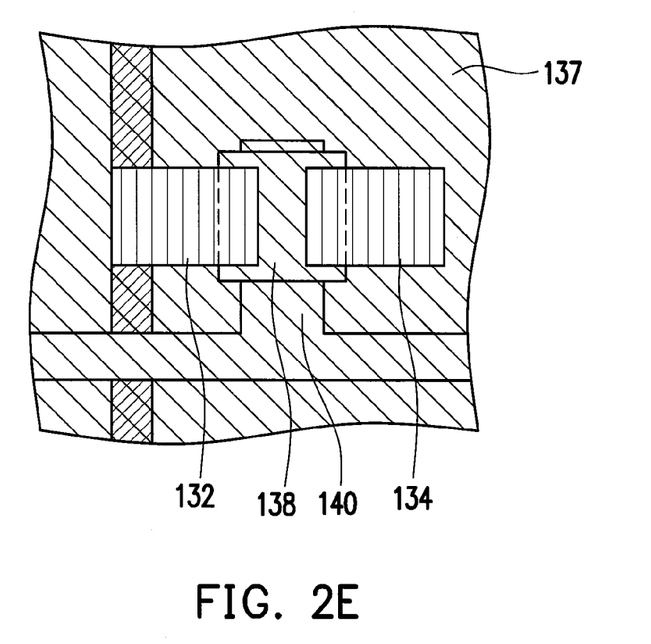

Then, with reference to FIG. 2E, the second source 132 and the second drain 134 are formed on the second doped amorphous silicon layer 136, wherein the second source 132 and the second drain 134 are separated from each other. Materials thereof are the same as the above-described. Accordingly, the second transistor 130 is formed based on the above.

Figure 2F:
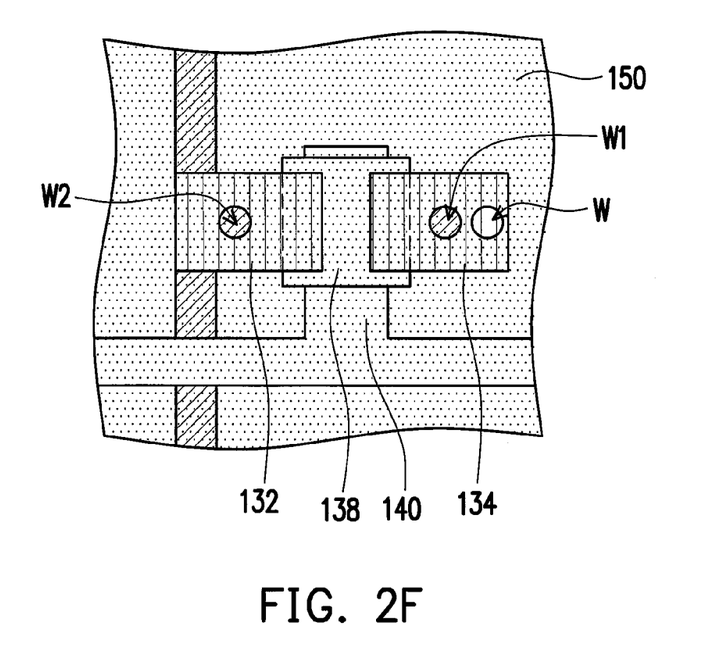

Referring to FIG. 2F, in this embodiment, the first transistor 120 and the second transistor 130 are, for example, electrically connected in parallel to improve an ON-current. With reference to FIGS. 1 and 2F, a first contact via W1 and a second contact via W2 are formed in the first gate insulating layer 127 and the second gate insulating layer 137. The first contact via W1 and the second contact via W2 respectively expose the first drain 124 and the first source 122, for electrically connecting the second drain 134 with the first drain 124 through the first contact via W1 and electrically connecting the second source 132 with the first source 122 through the second contact via W2.

It is noted that, as shown in FIGS. 1 and 2F, when the active device is applied in an active region as a switch of the pixel electrode, the dual-channel active device, formed of the first transistor and the second transistor that are electrically connected in parallel, can increase the ON-current. Herein, the second transistor 130 is further covered with a protective layer 150, and an opening W is formed in the protective layer 150 to expose the second drain 134, for electrically connecting the pixel electrode 160 with the second drain 134 via the opening W.

Figure 3:
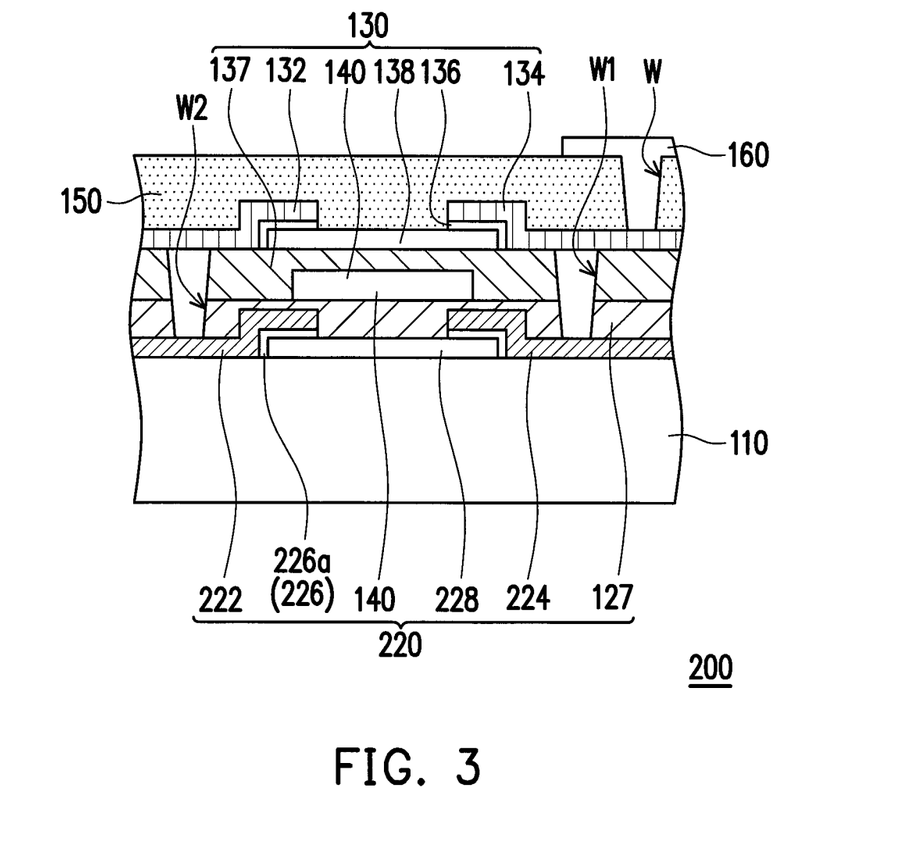
FIG. 3 is a schematic cross-sectional view of an active device array substrate according to the second embodiment of the disclosure.

Moreover, FIG. 3 is a schematic cross-sectional view of another active device in an active device array substrate according to the second embodiment of the disclosure. As depicted in FIG. 3, an active device array substrate 200 of this embodiment has elements similar to the elements of the active device array substrate in FIG. 1. A main difference lies in that: a first channel layer 228, a first source 222, a first drain 224, and a first doped amorphous silicon layer 226 of a first transistor 220 are stacked in a different order. More specifically, in the active device array substrate 200 of this embodiment, the first source 222 and the first drain 224 are located between the first gate insulting layer 127 and the first channel layer 228. By contrast, in the active device array substrate 100 of the first embodiment, the first channel layer 128 is located between the first gate insulting layer 127 and the first source 122 and the first drain 124.

According to this embodiment, the channel length is also doubled within the limited area to increase the charge capacity of the TFT device. A brief explanation of a manufacturing process of the active device array substrate in the second embodiment is provided below. FIGS. 4A~4F are schematic top views, illustrating the manufacturing process of the active device array substrate according to the second embodiment of the disclosure.

Figure 4A:
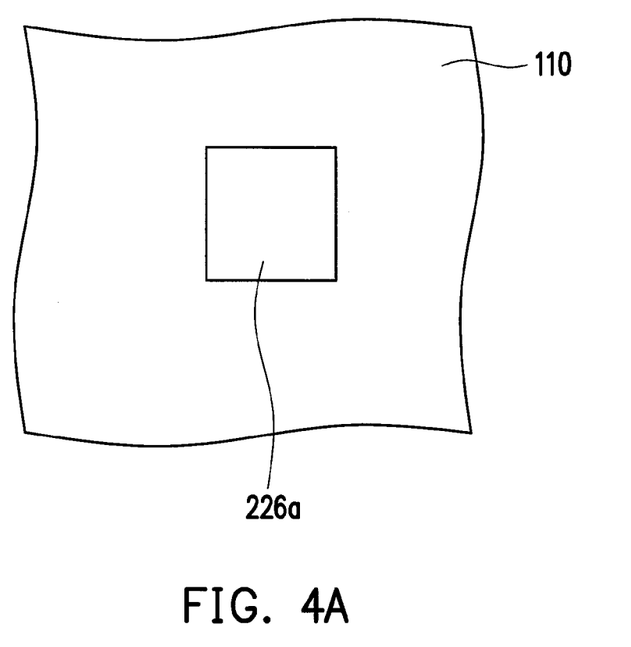
FIGS. 4A~4F are schematic top views, illustrating a manufacturing process of the active device array substrate according to the second embodiment of the disclosure.

Referring to FIGS. 3 and 4A (the top view of FIG. 4A only depicts the layers that are seen from the top; thus, a part of the elements are not shown in FIG. 4A; please also refer to FIG. 3 for relative positions of the described elements), a channel layer (not shown) and the first doped amorphous silicon layer (not shown) are formed sequentially on the substrate 110. The channel layer and the first doped amorphous silicon layer are patterned simultaneously to form a first channel layer 228 and a first doped amorphous silicon pattern 226a. Herein, the first channel layer 228 and the first doped amorphous silicon pattern 226a have the same configuration, such as a rectangular pattern.

Figure 4B:
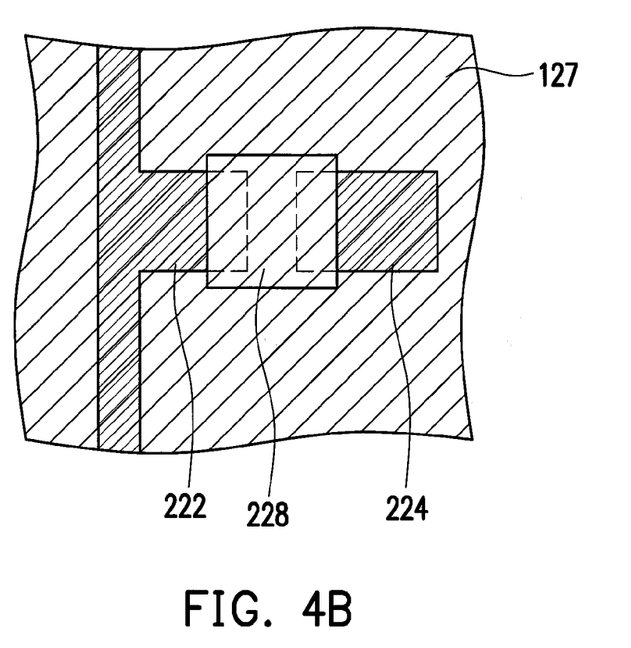
Figure 4C:
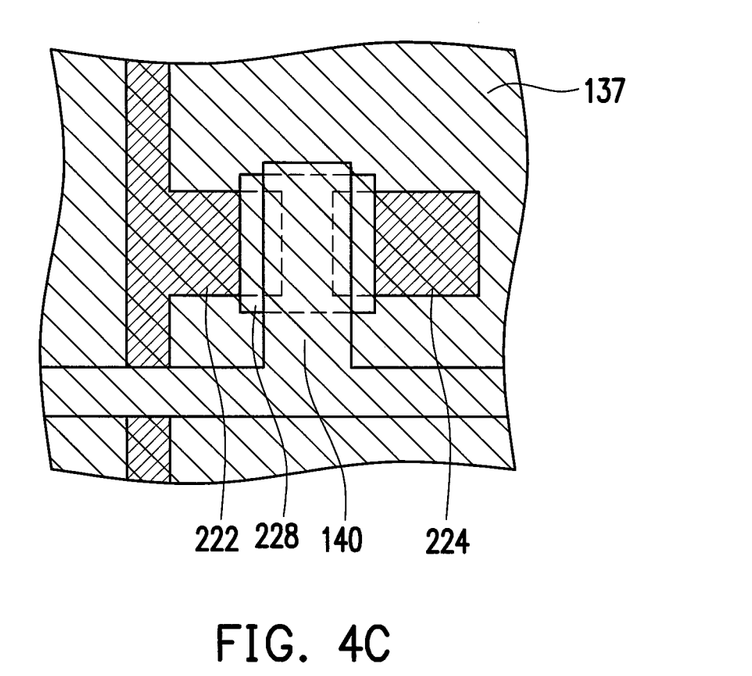
Figure 4D:
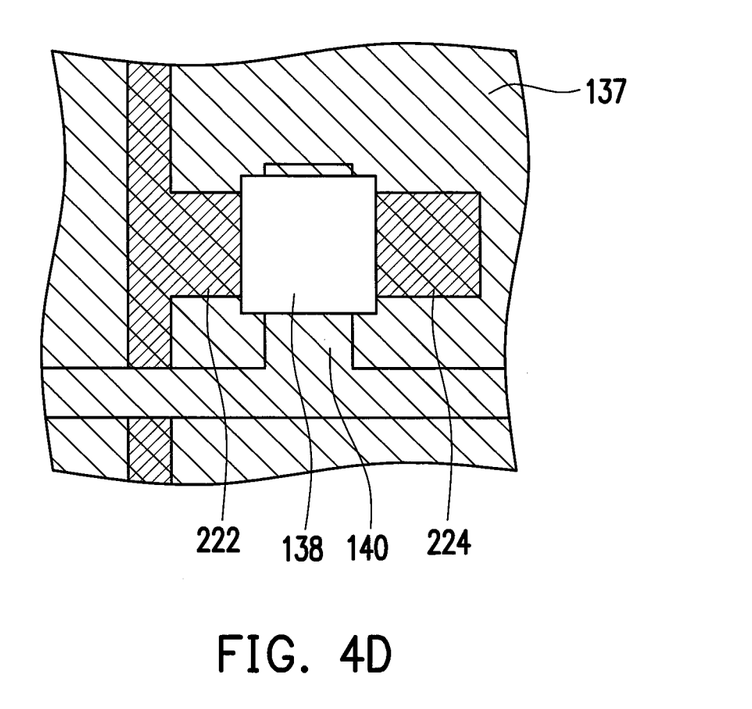
Figure 4E:
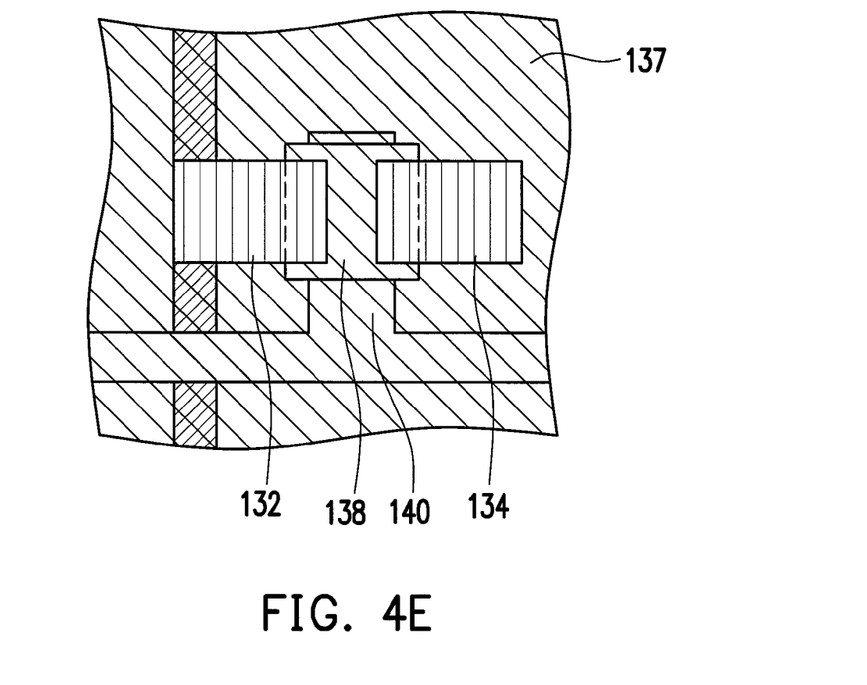
Figure 4F:
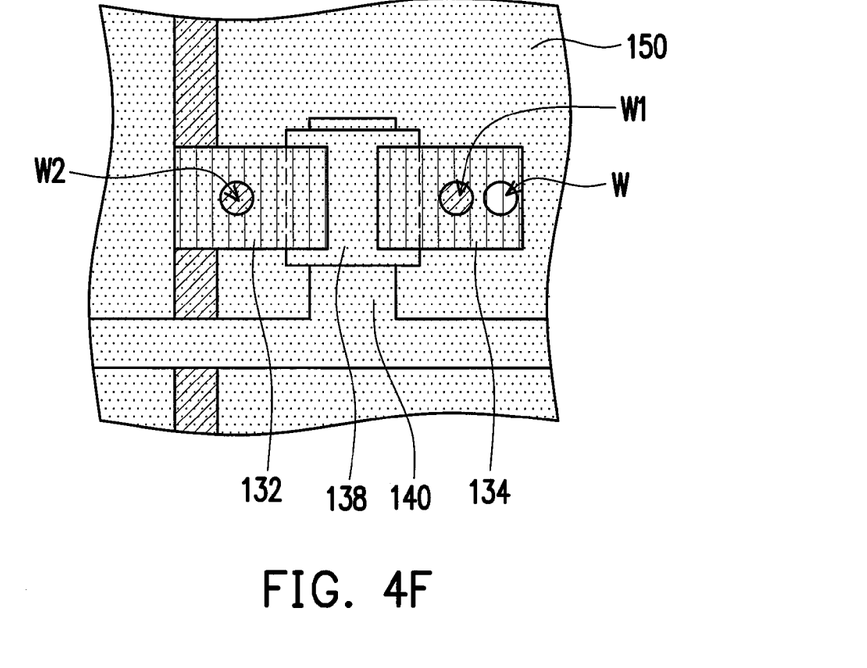

Then, referring to FIGS. 3 and 4B, a first metal layer (not shown) is formed on a side of the first channel layer 228 opposite to the substrate 110, for example, by using one photomask to pattern the first metal layer and the first doped amorphous silicon pattern 226a, so as to expose the first channel layer 228. Accordingly, the first source 222 and the first doped amorphous silicon pattern 226a that are aligned with each other are formed on the first channel layer 228, and the first drain 224 and the first doped amorphous silicon pattern 226a that are aligned with each other are formed.

The following manufacturing process in FIGS. 4C~4F is the same as the process in FIGS. 2C~2F. Therefore, the descriptions thereof are omitted hereinafter. It is noted that, in the active device array substrate 200 in FIG. 3, the first source 222 and the first drain 224 are disposed between the first gate insulating layer 127 and the first channel layer 228. A material of the first channel layer 228 is crystalline silicon, amorphous silicon, polysilicon, a metal oxide, a transparent conductive oxide semiconductor material, etc. In terms of the category of the thin film transistor, it is noted that the structure having the first source 222 and the first drain 224 between the first gate insulating layer 127 and the first channel layer 228 is a back channel thin film transistor. The channel in this embodiment is directly formed by a standard BCE process, and thus the manufacturing process is simpler in comparison with FIG. 1. FIG. 1 is a front channel thin film transistor and has an advantage that: the front channel thin film transistor of the first embodiment has better ON-current efficiency when compared with the back channel thin film transistor of the second embodiment.

In the first and the second embodiments, the first transistor and the second transistor in the active device array substrate are electrically connected in parallel to increase an effective width of the device, so as to improve the ON-current. However, the active device array substrate of the disclosure can also be formed by electrical connection in series, so as to integrate the circuit layout by vertical structure and further reduce the circuit area. Details are provided below.

Figure 5:
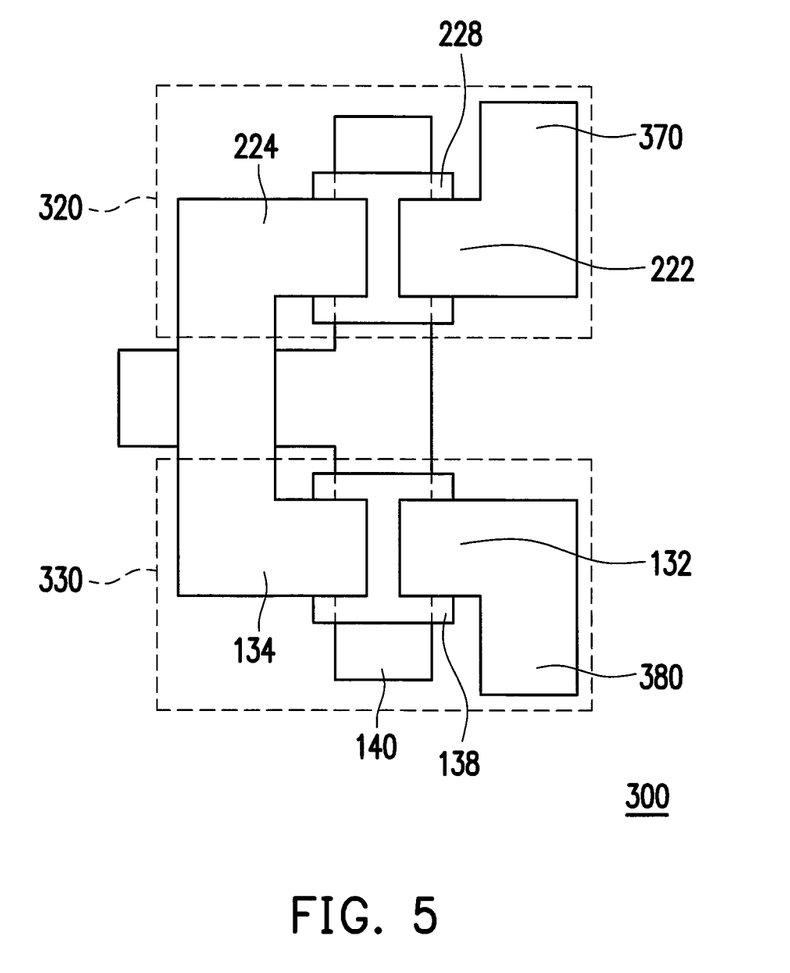
FIG. 5 is a schematic top view depicting an active device array substrate as a comparison example of the embodiment.

FIG. 5 is a schematic top view depicting an active device in an active device array substrate as a comparison example relative to the embodiment. To make the following explanation easily understandable, only a portion of the elements are illustrated in the figure. An active device 300 in the active device array substrate includes a first transistor 320, a second transistor 330, and the common gate electrode 140, wherein the first transistor 320 and the second transistor 330 are connected in series in a two-dimensional planar structure, as shown in FIG. 5. More specifically, the first transistor 320 includes the first source 222, the first drain 224, the first channel layer 228, and a signal receiving trace 370 electrically connected with the first source 222. The second transistor 330 includes the second source 132, the second drain 134, the second channel layer 138, and a signal outputting trace 380 electrically connected with the second source 132. Moreover, the first drain 224 of the first transistor 320 and the second drain 134 of the second transistor 330 are connected. This structure clearly shows that a circuit area occupied by the active device is directly proportional to the number of the transistors that are connected in series or the number of series connections. In other words, this type of active device structure occupies a larger area of the circuit. Accordingly, the area of the whole circuit is reduced by decreasing the area of series connection of the transistors.

Figure 6A:
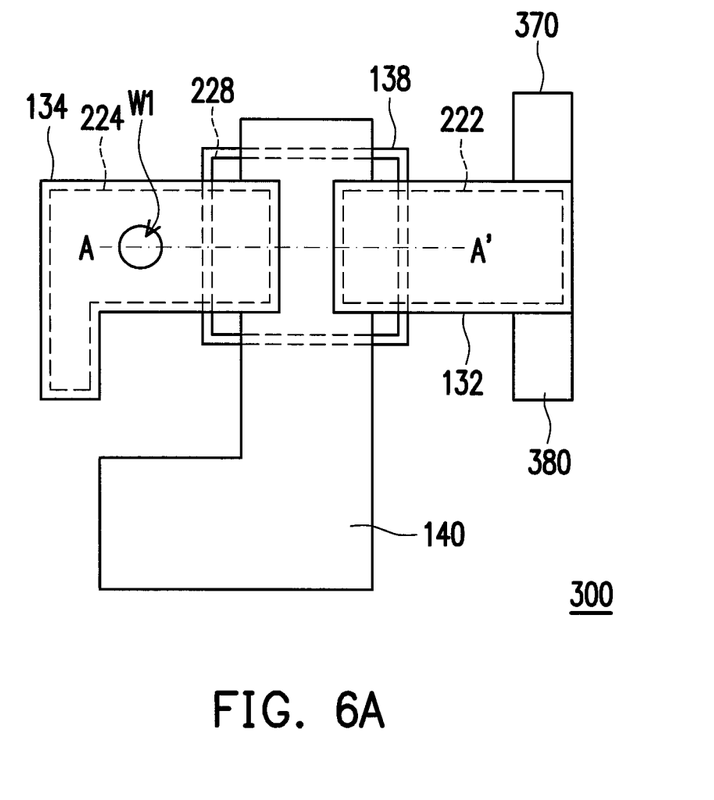
FIG. 6A is a schematic top view of an active device array substrate according to the third embodiment of the disclosure.
Figure 6B:
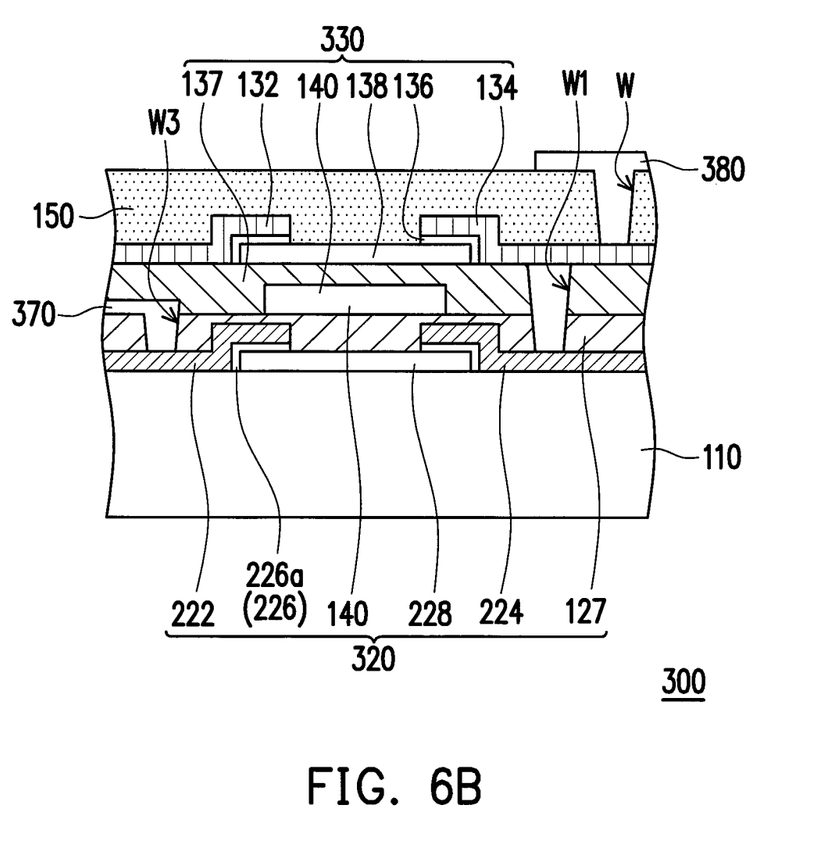
FIG. 6B is a schematic cross-sectional view taken along the line A-A' in FIG. 4A.

FIG. 6A is a schematic top view of an active device in an active device array substrate according to the third embodiment of the disclosure, which is an improvement to the layout space of the active device in the conventional active device array substrate of FIG. 5. FIG. 6B is a schematic cross-sectional view taken along the line A-A' in FIG. 6A. Referring to FIGS. 6A and 6B, identical elements are indicated by the same reference numbers. According to the disclosure, the first transistor 320 and the second transistor 330 in the active device 300 of FIG. 5 are stacked in the form of a three-dimensional structure, and the first drain 224 of the first transistor 320 and the second drain 134 of the second transistor 330 are electrically connected through the first contact via W1, so as to connect the two transistor 320 and 330 in series. In addition, an opening W is formed in the protective layer 150 on the second drain 134 of the second transistor 330, and the signal outputting trace 380 is electrically connected with the second drain 134 of the second transistor 330 via the opening W. A third contact via W3 is formed in the first gate insulating layer 127 on the first source 222 of the first transistor 320, and the signal receiving trace 370 is electrically connected with the first source 222 through the third contact via W3. FIG. 6A and FIG. 5 clearly show that the vertical structure used in this embodiment effectively reduces the circuit area occupied by the series connection of the transistors in comparison with the comparison example. Moreover, this structure reduces the occurrence of leakage current.

It is noted that this active device is also applicable in an active region for operating the pixel electrode and increasing the ON-current. Herein, the second transistor 330 is covered with the protective layer 150, and the opening W is formed in the protective layer 150 to expose the second drain 134, so as to electrically connect the pixel electrode configured in a position of the signal outputting trace 380 with the second drain 134 via the opening W.

Figure 7:
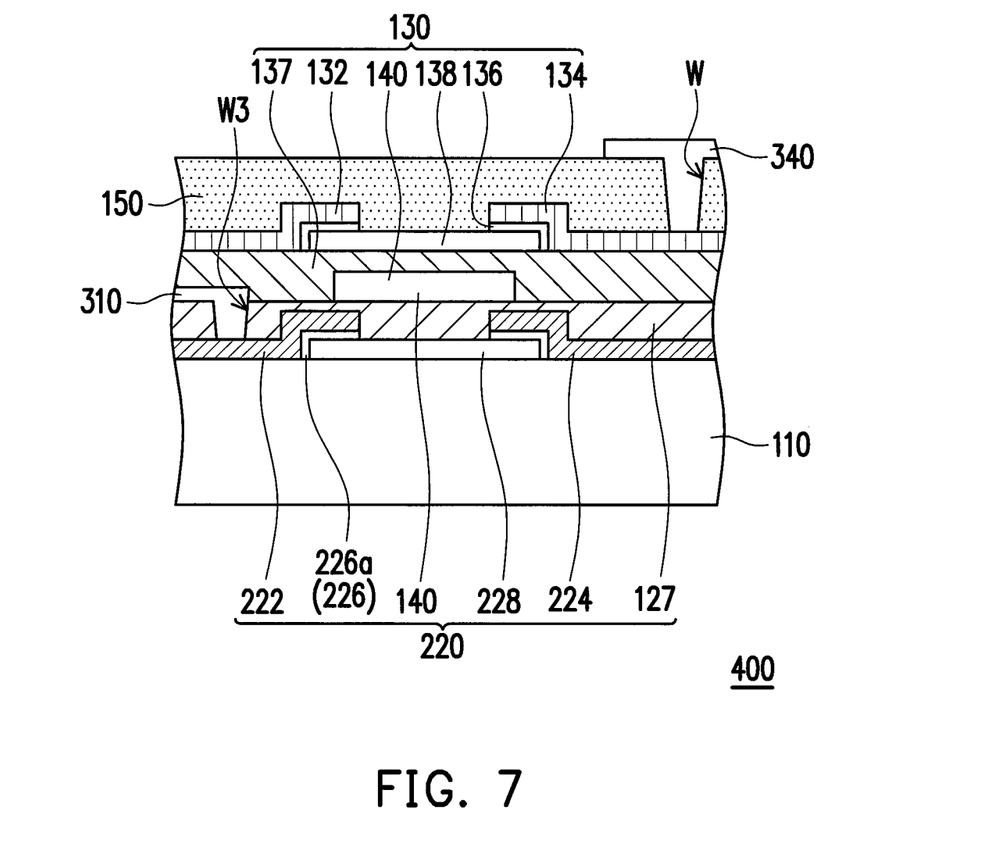
FIG. 7 is a schematic cross-sectional view of an active device array substrate according to an embodiment of the disclosure.

The active device of the disclosure is applicable not only to the aforementioned active region but also to a trace layout of a peripheral circuit in other embodiments. FIG. 7 is a schematic cross-sectional view of an active device array substrate according to the third embodiment of the disclosure. With reference to FIG. 7, a method for manufacturing the trace layout of the peripheral circuit is the same as the disclosure of FIGS. 4A~4F. Therefore, detailed explanation is omitted hereinafter. A main difference between an active device 400 in FIG. 7 and the active device 300 in FIG. 6B is that: in the active device 400, no contact via W1 is formed between the first drain 224 and the second drain 134 to pass through the first insulating layer 127 and the second insulating layer 137. Only the third contact via W3 is formed in the first gate insulating layer 127 to expose the first source 222, and the first signal line 310 is electrically connected with the first source 222 through the third contact via W3. Further, the second transistor 130 is covered with the protective layer 150, and the opening W is formed in the protective layer 150 for electrically connecting the second signal line 340 with the second drain 134 via the opening W. Accordingly, the active device array substrate 300 of the third embodiment achieves the effect of reducing the layout area of the active device. Specifically, configuring two active devices in the same area of the circuit by vertical structure effectively decreases light-shielding area, further reduces device size, and improve aperture ratio.

As described above, the embodiments of the disclosure utilize series and parallel connections of the first and the second transistors in the vertical structure to improve the ON-current, decrease leakage current, and reduce the area occupied by the devices in the limited space. Further details of an embodiment are provided below.

Figure 8:
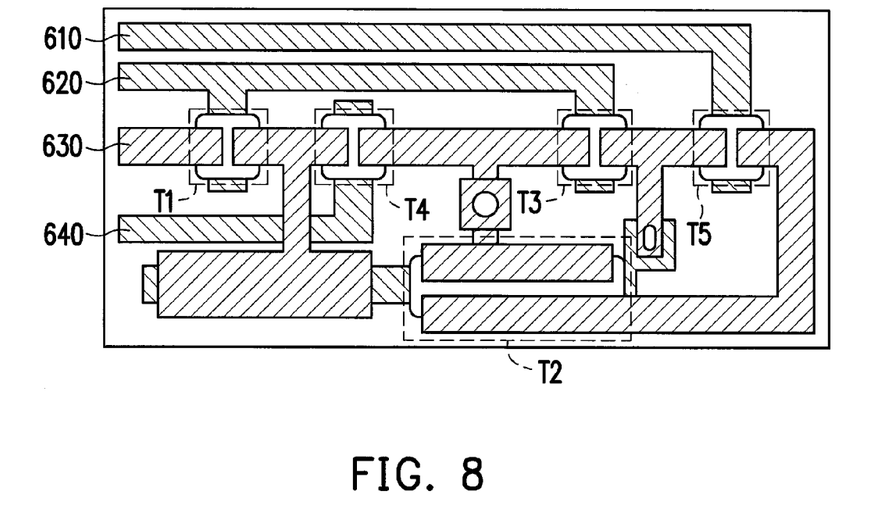
FIG. 8 is a schematic top view of a circuit layout in a comparison example.
Figure 9:
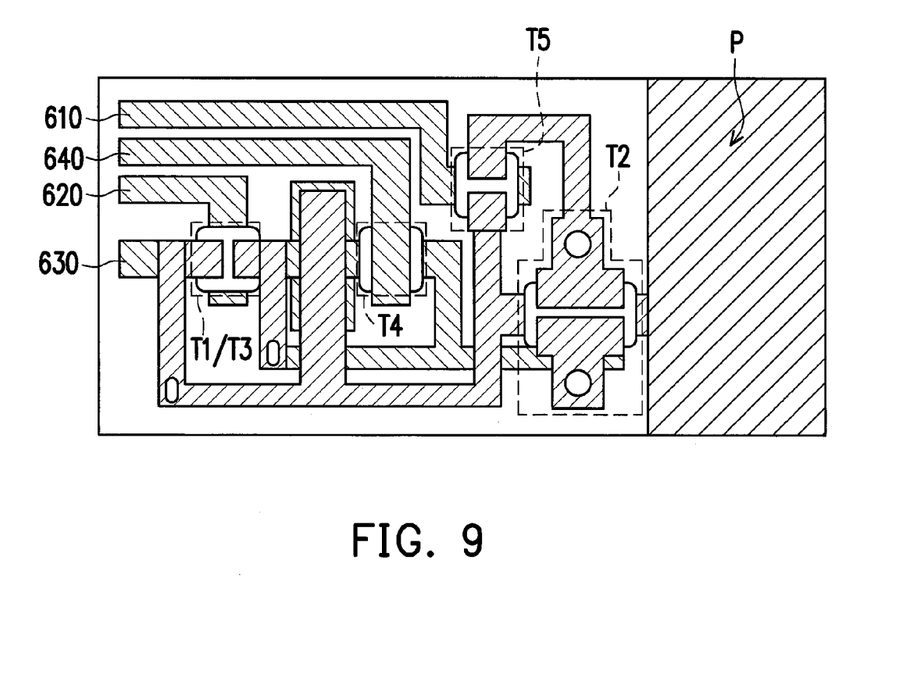
FIG. 9 is a schematic top view of a peripheral circuit layout in an embodiment of the disclosure.

FIG. 8 is a schematic top view of a peripheral circuit layout in a comparison example. FIG. 9 is a schematic top view of a circuit layout in an embodiment of the disclosure. The circuit layout in FIG. 8 includes five transistors T1~T5 and a plurality of traces, wherein the traces include a gate electrode 610 of a clock signal, a gate electrode 620 of a selection signal, a gate electrode 630 of a data line, and a gate electrode 640 of an emission control circuit, for example. In FIG. 8, the first transistor T1 and the third transistor T3 share the gate electrode 620, and the second transistor T2 occupies a larger circuit area in consideration of W/L ratio. The design of the active device in the above embodiment of the disclosure is used to integrate the circuit of FIG. 8 as shown in FIG. 9. More specifically, the first transistor T1 and the third transistor T3 are integrated by using the vertical structure, so as to configure two transistors in the area for one transistor. In addition, the aforementioned parallel connection is used to reduce the circuit area occupied by the second transistor T2 by ½~⅓. Therefore, the aperture ratio is increased effectively and a usable space P in the circuit is increased as well. If more active devices share the gate electrode in the circuit, the circuit is better integrated.

It is worth mentioning that the active device of the disclosure also has favorable performance when applied in OLED. According to the embodiments of the disclosure, the ON-current is improved without increasing the size of the active device. Therefore, the conventional problem that large-sized active device may result in threshold voltage shift is prevented.

In conclusion of the above, the active device in the active device array substrate of the disclosure utilizes vertical structure to form a single gate electrode between dual channels, that is, configuring the common gate electrode in the middle of the active device formed by the two transistors, so as to dispose the common gate electrode between the top and the bottom active layers. Accordingly, channels are respectively generated in the top and the bottom active layers when the gate electrode is driven by voltage, thereby achieving the effect of dual channels and multiplying the ON-current of the device. Furthermore, the circuit layout is integrated vertically by series and parallel connections to reduce the size of the device. Therefore, the disclosure provides a high-performance active device that utilizes space more efficiently while satisfying the demand for high current, high resolution, and high pixel aperture ratio.

It will be apparent to those skilled in the art that various modifications and variations can be made to the structure of the disclosure without departing from the scope or spirit of the disclosure. In view of the foregoing, it is intended that the disclosure covers modifications and variations provided they fall within the scope of the following claims and their equivalents.

What is claimed is:

1. An active device array substrate, comprising:
a substrate; and
a plurality of active devices disposed on the substrate, wherein at least one of the active devices comprises:
a first transistor disposed on the substrate, wherein the first transistor comprises:
a first channel layer, wherein a material of the first channel layer is amorphous silicon;
a first source and a first drain disposed between a common gate electrode and the substrate;
a first doped amorphous silicon layer disposed between the first source and the first channel layer and between the first drain and the first channel layer; and
a first gate insulating layer disposed between the common gate electrode and the first channel layer; and
a second transistor stacked on the first transistor, wherein the second transistor comprises a second channel layer, the first transistor and the second transistor share the common gate electrode.

2. The active device array substrate as claimed in claim 1, wherein the common gate electrode is positioned between the first channel layer and the second channel layer.

3. The active device array substrate as claimed in claim 1, wherein the first channel layer is disposed between the first gate insulating layer and the first source and between the first gate insulating layer and the first drain.

4. The active device array substrate as claimed in claim 1, wherein the first source and the first drain are disposed between the first gate insulating layer and the first channel layer.

5. The active device array substrate as claimed in claim 1, wherein the second transistor comprises:
a second gate insulating layer disposed between the common gate electrode and the second channel layer;
a second source and a second drain disposed on two sides of the second channel layer; and
a second doped amorphous silicon layer disposed between the second source and the second channel layer and between the second drain and the second channel layer.

6. The active device array substrate as claimed in claim 5, wherein the second channel layer is disposed between the second gate insulating layer and the second source and between the second gate insulating layer and the second drain.

7. The active device array substrate as claimed in claim 5, wherein the first gate insulating layer and the second gate insulating layer comprise a first contact via that exposes the first drain, and the second drain is electrically connected with the first drain through the first contact via.

8. The active device array substrate as claimed in claim 7, further comprising a signal receiving trace and a signal outputting trace, wherein the signal receiving trace is electrically connected with the first source, and the signal outputting trace is electrically connected with the second source.

9. The active device array substrate as claimed in claim 5, wherein the first gate insulating layer and the second gate insulating layer further comprise a second contact via that exposes the first source, and the second source is electrically connected with the first source through the second contact via.

10. The active device array substrate as claimed in claim 9, further comprising a protective layer and a pixel electrode, wherein the protective layer comprises an opening exposing the second drain, and the pixel electrode being electrically connected with the second drain through the opening.

11. The active device array substrate as claimed in claim 5, further comprising a protective layer, a first signal line, and a second signal line, wherein the first gate insulating layer comprises a third contact via that exposes the first source, the first signal line is electrically connected with the first source through the third contact via, the protective layer comprises an opening exposing the second drain, and the second signal line is electrically connected with the second drain through the opening.

12. The active device array substrate as claimed in claim 1, wherein the first transistor and the second transistor are electrically connected in series.

13. The active device array substrate as claimed in claim 1, wherein the first transistor and the second transistor are electrically connected in parallel.

14. An active device disposed on a substrate, the active device comprising:
a first transistor disposed on the substrate, wherein the first transistor comprises:
a first channel layer, wherein a material of the first channel layer is amorphous silicon;
a first source and a first drain disposed between a common gate electrode and the substrate;
a first doped amorphous silicon layer disposed between the first source and the first channel layer and between the first drain and the first channel layer; and
a first gate insulating layer disposed between the common gate electrode and the first channel layer; and
a second transistor stacked on the first transistor, wherein the second transistor comprises a second channel layer, the first transistor and the second transistor share the common gate electrode.

15. The active device as claimed in claim 14, wherein the common gate electrode is positioned between the first channel layer and the second channel layer.

* * * * *